(12) United States Patent
Grespan

(10) Patent No.: US 8,330,053 B2
(45) Date of Patent: Dec. 11, 2012

(54) OPTOELECTRONIC DEVICE AND METHOD FOR PRODUCING AN OPTOELECTRONIC DEVICE

(75) Inventor: Silvio Grespan, Penang (MY)

(73) Assignee: Osram Opto Semiconductors GmbH, Regensburg (DE)

( * ) Notice: Subject to any disclaimer, the term of this patent is extended or adjusted under 35 U.S.C. 154(b) by 1004 days.

(21) Appl. No.: 12/144,516

(22) Filed: Jun. 23, 2008

(65) Prior Publication Data

US 2009/0133916 A1    May 28, 2009

Related U.S. Application Data

(63) Continuation of application No. 11/924,348, filed on Oct. 25, 2007, now abandoned.

(30) Foreign Application Priority Data

Oct. 25, 2006   (DE) .......................... 10 2006 050 370
Dec. 14, 2006   (DE) .......................... 10 2006 059 168

(51) Int. Cl.
    H05K 1/16         (2006.01)

(52) U.S. Cl. ...................... 174/260; 361/777

(58) Field of Classification Search .................. 174/260; 361/777–779
See application file for complete search history.

(56) References Cited

U.S. PATENT DOCUMENTS

| | | | | |
|---|---|---|---|---|
| 5,844,249 | A  * | 12/1998 | Takano et al. | 356/237.1 |
| 6,184,477 | B1 * | 2/2001 | Tanahashi | 174/261 |
| 7,544,897 | B2 * | 6/2009 | Kobayashi | 174/254 |
| 2003/0027369 | A1 | 2/2003 | Yamazaki | |
| 2004/0012383 | A1 * | 1/2004 | Kimura | 324/158.1 |
| 2004/0218339 | A1 * | 11/2004 | Nakamura | 361/234 |

FOREIGN PATENT DOCUMENTS

| | | |
|---|---|---|
| EP | 1 058 311 | 6/2000 |
| JP | 2006-163110 | 6/2006 |
| JP | 2006-185650 | 7/2006 |
| WO | WO 02/39513 | 5/2002 |
| WO | WO 02/078101 | 10/2002 |
| WO | WO 03/034513 | 4/2003 |

* cited by examiner

*Primary Examiner* — Jeremy Norris
(74) *Attorney, Agent, or Firm* — Fish & Richardson P.C.

(57) ABSTRACT

An optoelectronic device includes an optoelectronic component, the optoelectronic component having an active region and at least one first conductive path on a first substrate, wherein the first conductive path is electrically connected to the active region. Further, the optoelectronic device comprises a second substrate with at least one second conductive path, wherein the first conductive path and the second conductive path are electrically connected to one another.

31 Claims, 5 Drawing Sheets

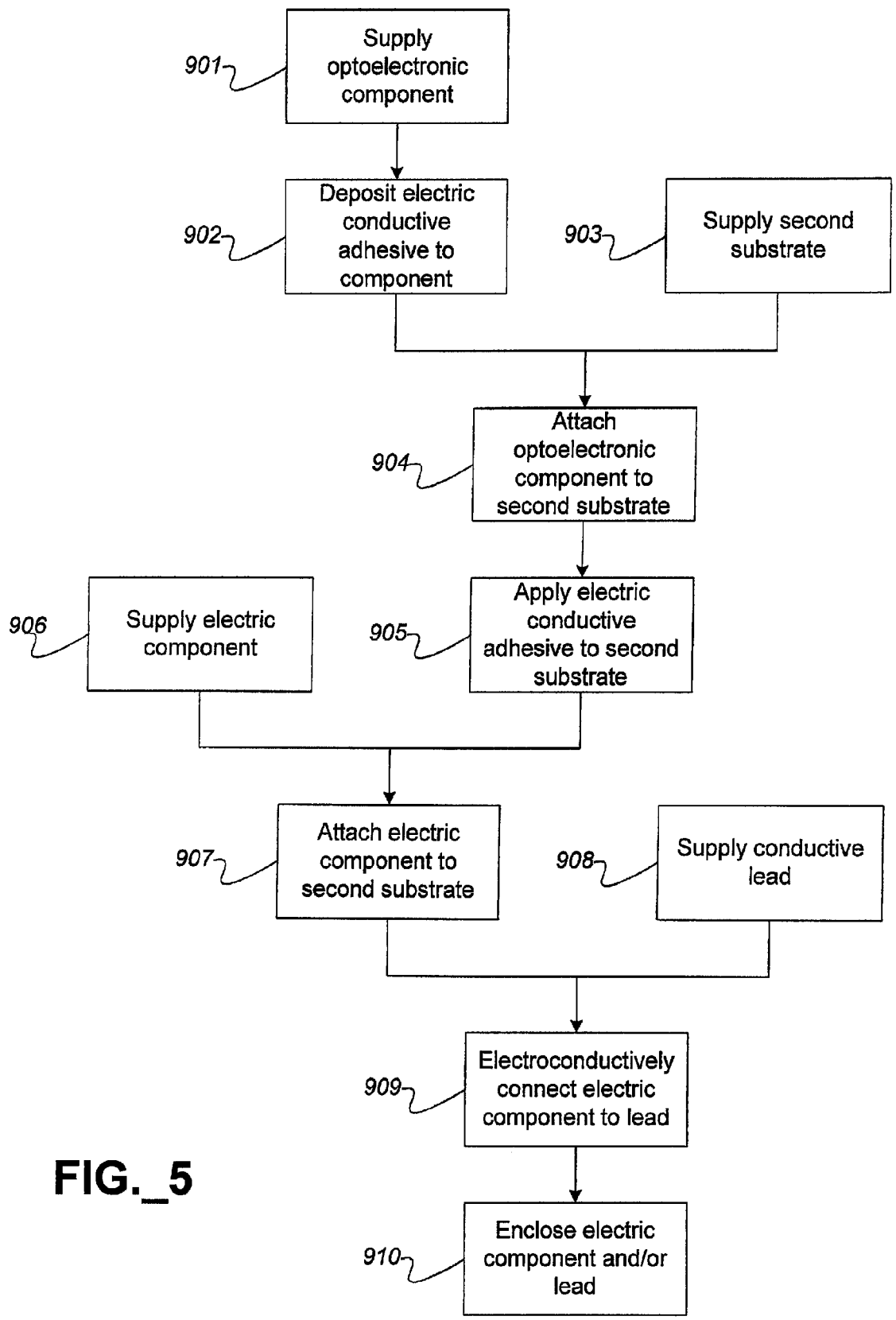
FIG._5

OPTOELECTRONIC DEVICE AND METHOD FOR PRODUCING AN OPTOELECTRONIC DEVICE

CROSS-REFERENCE TO RELATED APPLICATIONS

This application is a continuation and claims the benefit of priority under 35 U.S.C. Section 120 of U.S. application Ser. No. 11/924,348, filed Oct. 25, 2007. The disclosure of the prior application is considered part of and is incorporated by reference in the disclosure of this application.

BACKGROUND

This disclosure describes optoelectronic devices and methods for the fabrication of optoelectronic devices.

Optoelectronic devices can generate or detect light and have a wide range of applications. Common light emitting optoelectronic devices are light emitting diodes, which when forwardly biased produce visible light. Some types of light emitting diodes use organic layers, such as in the light emitting layer. The organic materials can be either polymer or small molecule type materials. Common light detecting optoelectronic devices are photodiodes, which when exposed to light produce current. Because of the usefulness of such optoelectronic devices, it can be advantageous to incorporate the devices into other larger systems.

SUMMARY

Specific embodiments provide an optoelectronic device with an optoelectronic component that is electroconductively connected to a substrate. Methods for the fabrication of such an optoelectronic device are also provided.

BRIEF DESCRIPTION OF THE FIGURES

Additional advantages and advantageous embodiments and advanced designs of the invention result from embodiments in the following described in connection with FIGS. 1A to 5.

In particular:

FIG. 5 shows a procedure for the fabrication of an optoelectronic device according to one embodiment.

Figure 1A:
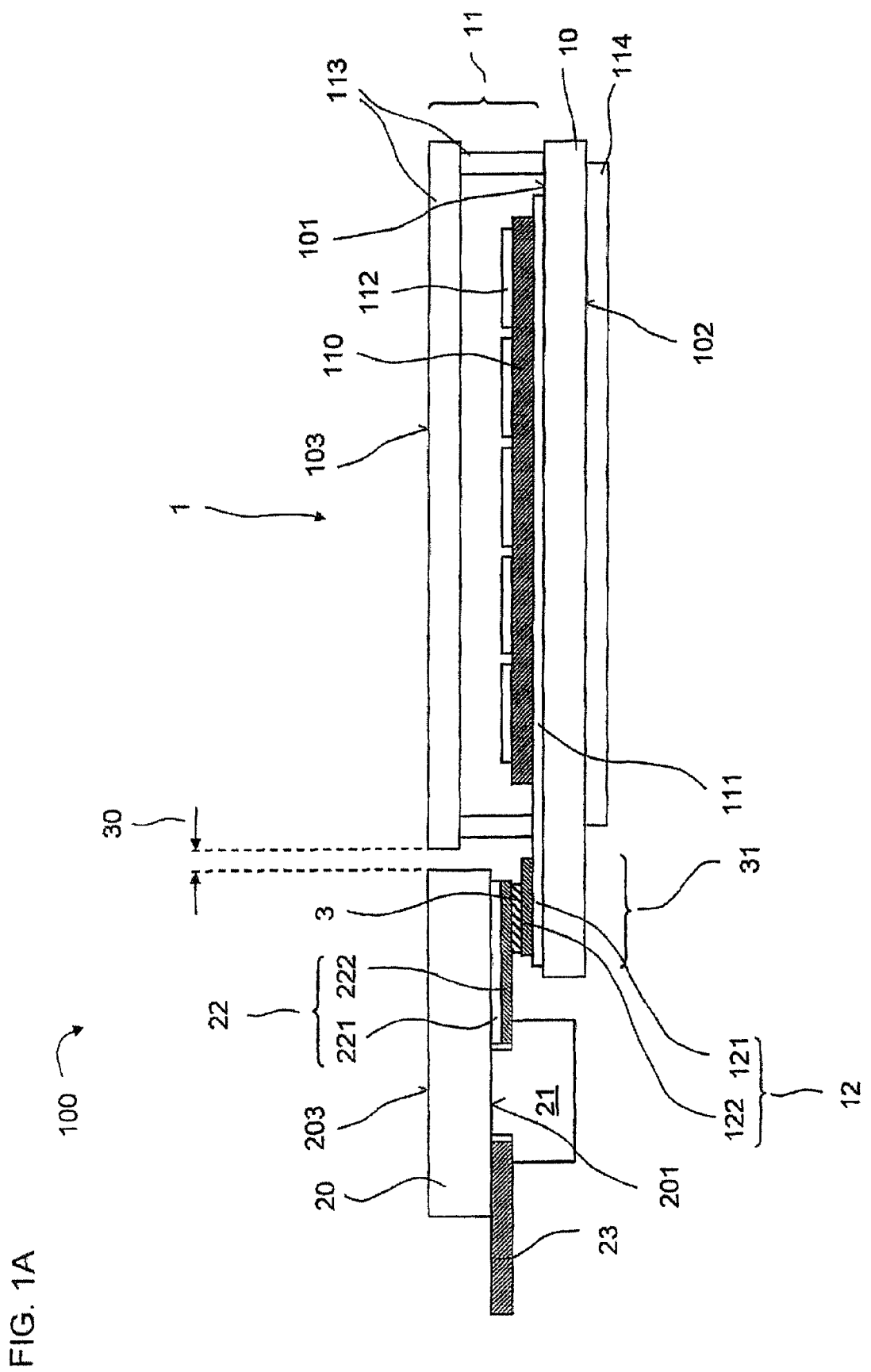
FIG. 1A shows a schematic representation of an optoelectronic device according to one embodiment.

Equal or equally functioning parts in the embodiments and figures are referenced the same. The indicated elements and their dimensional ratios are not true to scale; instead, the thicknesses and dimensions of layers, assemblies, components and zones may be exaggerated for easier representation and/or better understanding.

DETAILED DESCRIPTION

In one embodiment, an optoelectronic device includes an optoelectronic component with an active zone and at least one first conductive path on one first substrate and a second substrate with at least one second conductive path. The first conductive path is electroconductively connected to the active zone and the first conductive path and the second conductive path are electroconductively interconnected.

In a further embodiment, the second substrate comprises a stiff material. "Stiff material" can mean in this context that the second substrate is or includes a suitable material with an appropriate thickness, so that the second material is not flexible or bendable when stress is applied to the material. The stiff material can also include a layer sequence of multiple materials, wherein the sequence of layers are not flexible or bendable.

In some embodiments, the second substrate contains glass or is made of glass. The second substrate can also contain a laminate or a layer sequence of multiple layers. In this context, at least one of the multiple layers can contain glass or be made of glass. In particular, a second substrate composed of a sequence of layers can have at least the layer of glass, on which the second conductive path is located. The second substrate can furthermore also contain a synthetic material.

In one embodiment, the first substrate has a first main surface, on which the active zone and the first conductive path are located. In particular, the active zone and the first conductive path can be located at least partially next to each other, so that the first conductive path extends towards the active zone across part of the first main surface.

The second substrate can furthermore have a second main surface, on which the second conductive path is located. In this case, the first substrate and the second substrate can be configured in relation to each other in such manner that the first main surface and the second main surface are facing each other. In particular, this can mean that the second substrate is located above the first substrate in such manner that the first main surface and the second main surface overlap in at least one contact zone. At least in the contact zone the first main surface and the second main surface are aligned in parallel to each other. "In a contact zone" can mean, in particular, that the first main surface and the second main surface each have a contact zone, and that the respective contact zones are in direct or indirect formfitting or material-fitting contact.

In a further embodiment, the first substrate and the second substrate are configured in relation to each other such that the first main surface and the second main surface at least partially do not overlap. This can mean, in particular, that the first main surface and the second main surface do not overlap outside the contact zone.

In some embodiments, the first main surface and second main surface are flat or planar. Furthermore, the first and the second main surfaces may be parallel to each other.

In some embodiments, the first conductive path is at least partially located in the contact zone of the first main surface and the second conductive path is at least partially located in the contact zone of the second main surface. In particular, the first conductive path may extend on the substrate's first main surface from the contact zone to the active zone.

In a further embodiment, the first conductive path may have multiple first conductive paths. Furthermore, the second conductive path may also have multiple second conductive paths. In this context, one first conductive path may be electrically connected to a second conductive path of the multiple conductive second paths, i.e., it is possible that respective pairs of first and second conductive paths may be electroconductively interconnected. The multiple first conductive paths and the multiple second conductive paths may at least in the contact zone be configured next to each other, in particular in regular distances to each other, on the first substrate or on the second substrate.

In some embodiments, the first conductive path and the second conductive path are electroconductively interconnected via an electrically conductive medium. This may mean, in particular, that the first conductive path and the second conductive path in the contact zone are electroconductively connected to each other. The first and the second conductive path may furthermore be connected via the electrically conductive medium in such material-fitting manner that the first substrate and the second substrate are in a mechanically stable manner linked to each other and permanently fixed to each other via the electrically conductive medium. The electrically conductive medium may, in particular, comprise an electrically conductive adhesive.

Furthermore, first conductive paths of a multiple number of first conductive paths and second conductive paths of a multiple number of second conductive paths may each be electroconductively connected via the electrically conductive medium. In order to avoid electrical contact between multiple first conductive paths of the multiple number of first conductive paths or between second conductive paths of the multiple number of second conductive paths, an electrically conductive adhesive can be the electrically conductive medium and may be structured into adhesive zones, so that exactly one adhesive zone electroconductively connects exactly one first conductive path to exactly one second conductive path.

The electrically conductive medium may comprise solder. Alternatively, the electrically conductive medium can be an electrically anisotropic conductive adhesive ("anisotropic conductive film" or "ACF"). Such adhesive is characterized by not being equally electrically conductive into all directions. In particular, the electrically anisotropic conductive adhesive may be designed to be electrically conductive in one direction only.

An electrically anisotropic conductive adhesive may therefore be applied between a multiple number of first and second conductive paths in an unstructured manner, so that pairs of a first and a second conductive path located above each other are electroconductively interconnected while neighboring or adjacent first or second conductive paths are not electroconductively connected to each other. The electrically conductive anisotropic adhesive may include an electrically conductive filling material, such as, electrically conductive particles, in an adhesive matrix, whereby the filling material is configured and laid out in such manner that electrically conductive paths are not created in all directions but only in one direction in the adhesive, such as in the direction of the first conductive paths to the second conductive paths. The size and the density of the filling material, i.e., the electrically conductive particles, for example, may be matched to the size and the spacing between adjacent first and/or second conductive paths.

An electrically anisotropic conductive adhesive therefore allows broad and especially unstructured adhesive connections between the first and the second substrate via a multiple number of first and second conductive paths in the contact zone with electrically conductive connections only between pairs of the first and the second conductive paths, so that undesired short circuits will be avoided. The electrically anisotropic conductive adhesive may also be appropriate to provide a bonding connection between the first main surface and the second main surface, so that the second substrate is permanently and mechanically stably attached to the optoelectronic component.

In a further embodiment, the first and/or the second conductive path contain a metal and/or an electrically conductive oxide. In particular, the first and/or the second conductive path may contain a layer with a metal and/or an electrically conductive oxide. Furthermore, the first and/or the second conductive path may include a sequence of layers with at least one first layer containing an electrically conductive oxide and a second layer containing a metal. The first layer with the electrically conductive oxide is preferably applied to the first or the second substrate, and the second layer with the metal is applied to the first layer. Furthermore, the electrically conductive oxide may be a transparent, electrically conductive oxide. The metal may located at least in the contact zone or on the entire first and/or second conductive path.

Transparent, electrically conductive oxides (in short "TCOs") are transparent, conductive materials, usually metal oxides like zinc oxide, tin oxide, cadmium oxide, titanium oxide, indium oxide or indium tin oxide (ITO). In addition to binary metal-oxygen compounds like $ZnO$, $SnO_2$ or $In_2O_3$, ternary oxygen-metal compounds like $Zn_2SnO_4$, $CdSnO_3$, $ZnSnO_3$, $MgIn_2O_4$, $GaInO_3$, $Zn_2In_2O_5$ or $In_4Sn_3O_{12}$ or combinations of different transparent electrically conductive oxides are part of the TCO group. Furthermore, the TCOs are not required to have a stoichiometric composition, and may also be p- or n-doped.

The metal may be chrome or copper. A conductive path with chrome or copper or a layer containing or being made of chrome or copper may advantageously have a low electric resistance. A conductive path with metal may furthermore provide good adhesion to the electrically conductive medium, which will provide a stable electrically conductive and mechanical connection between the conductive path and the electrically conductive medium.

In some embodiments, the optoelectronic device has at least two second substrates. Each of the second substrates may, in particular, have at least one second conductive path. Applied to the first substrate of the optoelectronic component may be at least two first conductive paths, wherein one of the at least two conductive paths is always electroconductively connected to a second conductive path of one of the at least two second substrates. The at least two second substrates may be adjacent to one another on the same side of the first substrate or on opposite sides of the first substrate, thus allowing contacting of the optoelectronic component from different sides.

In a further embodiment, the second substrate has at least one electric component, which is located on the second main surface of the second substrate and which is electro-conductively connected to the second conductive path. The electric component may, in particular, be suitable to drive the optoelectronic component and especially the active zone of the optoelectronic component. In this respect, an optoelectronic component may be provided with a first substrate whereby the first substrate does not need to have a zone for the attachment of the electric component. In particular, the contact zone on the first main surface of the first substrate may be of a smaller size than a zone that would be required for the attachment of the electric component, permitting a compact and space-saving design of the optoelectronic component.

The electric component may also be part of an electronic circuit suitable to control the optoelectronic component. In particular, the electric component may be an integrated circuit (IC) or an active or passive electronic component for electric circuits. Furthermore, a multiple number of electric components may be located on the second substrate. For example, the electrically conductive component may be attached or affixed to the second substrate by an adhesive or solder or by a plastic enclosure.

Alternatively or in addition, the electric component may also include an optoelectronic component. Such optoelectronic component on the second substrate may have characteristics like those of the optoelectronic component on the first substrate. This allows the electrical interconnection of a first substrate with an optoelectronic component and a second substrate with an optoelectronic component, and the electrical interlinking of the optoelectronic components.

It may be particularly advantageous if the second substrate contains glass or is made of glass so that the electric component can be applied to the second substrate with the known state of the art chip-on-glass (COG) technology. The electroconductive connection between the second conductive path and the electric component may be created via an electrically conductive adhesive, solder or bonding. The electrically conductive connection between the electric component and the second conductive path may be provided by an electrically anisotropic conductive adhesive, which at the same time is suitable to create a stable attachment of the electric component to the second substrate.

The electric component may furthermore be electrically connected to a lead. The electric component may be directly or indirectly electrically connected to the lead. In addition or alternatively, the second substrate may include at least one other second conductive path, which is electroconductively connected to the electric component as well as to the lead. Such lead may be a flexible plastic matrix ribbon with one or multiple conductive paths. The conductive paths may be interspaced at minimum distances of at least more than about 41 µm, such as more than about 50 µm, for example, more than about 100 µm. "Interspaced" and "distance" may in the following for conductive paths mean the center-to-center distance, i.e., the grid or screen of two neighboring conductive paths. The lead may be at least partially attached to the second substrate, in particular by means of an adhesive or by enclosure with a synthetic material.

The lead may be advantageous for the connection of the electric component and therefore also the optoelectronic component to an external current or voltage supply and/or an external control circuit or a part thereof.

In some embodiments, the first conductive paths of a multiple of first conductive paths are at least partially, especially in the contacting zone of the first main surface, interspaced by more than about 41 µm, for example by more than about 50 µm, such as by more than about 70 µm or by more than about 100 µm. In particular, the first conductive paths of a multiple of first conductive paths may be a distance from each other greater or equal to about 120 µm. Such interspacing of the first conductive paths may be advantageous, if the function of a previously supplied optoelectronic component shall be tested with an appropriate test fixture prior to the creation of an electrically conductive connection to the second substrate since the electric contacting of the optoelectronic component might be easier via electric contacts at the test fixture.

Furthermore, the second conductive paths of a multiple of second conductive paths on the second substrate may at least in the contacting area be such distance from each other. In the area of the electric component, the second conductive paths may, for example, be interspaced at distances of less or equal to about 50 µm and especially of about 41 µm. The distance of the second conductive paths in the area of the electric component may be matched to the interspacing of electric contacts on the electric component.

In some embodiments, the optoelectronic component has an active zone suitable to emit electromagnetic radiation during operation. The electromagnetic radiation can include a range of wavelengths, such as from ultraviolet to infrared wavelengths. Alternatively, the optoelectronic component may also be used to convert electromagnetic radiation into electric current or an electric voltage. The optoelectronic component may, in particular, be designed as an organic optoelectronic component with an active zone comprising at least one organic material or a coating of one organic material.

An organic light-emitting diode (OLED) type optoelectronic component in the active zone may have a first electrode on the first main surface of the first substrate. Deposited on top of the first electrode can be a functional zone with one or multiple layers of organic materials. The functional layers may be electron transport layers, electroluminescent layers and/or hole transport layers. A second electrode can be applied above the functional layers. In the functional layers, electromagnetic radiation of a single wavelength or of a range of wavelengths may be generated by electron and hole injection and recombination. For the viewer, this results in a single-color, multi-color and/or mixed-color luminous impression.

The first electrode and/or the second electrode can be applied broadly across the substrate or can be structured into first and second electrode partitions. For example, the first electrode can be configured in the form of parallel first electrode strips, and the second electrode as parallel second electrode strips running perpendicular to the first. Overlaps of the first and second electrode strips can therefore be designed as image zones that can be controlled or driven separately. Furthermore, in some embodiments, only the first or only the second electrode is structured. In one embodiment, the first and/or the second electrode or partial sections of the electrodes are electroconductively connected to first conductive paths. In doing so, one electrode or one electrode section can transition into a first conductive path or can be separate from the first conductive path and electroconductively connected to it.

In a further embodiment, the first substrate comprises glass. Alternatively or in addition, the first substrate can also comprise quartz, plastic film, metal, metal film, silicon wafer or any other suitable substrate material. If the optoelectronic component is configured as an OLED and in particular as a so-called "bottom emitter", i.e., the radiation generated in the functional zones is emitted through the first substrate, then the substrate can advantageously be transparent for at least part of the electromagnetic radiation generated in the active zone.

In the bottom-emitter configuration, the first electrode can be transparent for at least part of the electromagnetic radiation generated in the active zone. A transparent first electrode, which can be configured as an anode and therefore serves as hole-inducing material, can include a transparent electrically conductive oxide or be made of a transparent electrically conductive oxide. Suitable transparent electrically conductive oxides are described further above.

The functional layers can comprise organic polymers, organic oligomers, organic monomers, organic small, non-polymer molecules ("small molecules") or combinations thereof.

The second electrode can be configured as a cathode and can therefore serve as an electron-inducing material. Useful cathode materials, among others can include aluminum, barium, indium, silver, gold, magnesium, calcium, or lithium as well as compounds, combinations and alloys thereof. In addition or alternatively, the second electrode can also be transparent and/or the first electrode can also be a cathode and the second electrode can be an anode. If the top layer is transparent, then the OLED can be a "top emitter".

The active zone can also exhibit features and components for active or passive displays or lighting fixtures such as thin film transistors (TFTs).

The active zone can be encapsulated in order to protect the electrodes and the functional zone from humidity and/or oxidizing substances like oxygen. The encapsulation can comprise one or multiple layers, wherein the layers of the encapsulation can be, for example, planarization layers, barrier layers, water and/or oxygen-absorbing layers, connecting layers or combinations thereof.

Furthermore, an OLED-configured optoelectronic component can also include optical elements downstream of the active zone, i.e., in the direction in which the electromagnetic radiation is emitted. Located on a main surface of the first substrate, located opposite of the first main surface (in the case of a bottom-emitter) or above the encapsulation or as part thereof (in the case of a top-emitter) can be a circular polarizer, which advantageously prevents the back reflection of light by the OLED, which is radiated from the outside onto the active zone, and which can be reflected at the electrodes, for example.

In one embodiment, the active zone and the second substrate are located next to each other. The active zone and the second substrate can be a distance of greater or equal to 0.1 mm from each other. Such distance can be advantageous if the first substrate and the active zone or the encapsulation in comparison to the second substrate have different temperature expansion coefficients, so that in the event of temperature changes, stresses and forces between the active zone and the second substrate can be avoided. In addition, such distance can be advantageous for fabrication and assembly tolerances. A distance of less than 1 mm can be advantageous for a compact and space-saving design of the optoelectronic device.

In some embodiments, the second substrate has a thickness such that the second substrate does not extend past the optoelectronic component and especially does not overlap the active zone. It can furthermore be advantageous if the optoelectronic component and especially the active zone do not overlap the second substrate. This can be possible if a main surface of the second substrate located opposite the second main surface and an adjacently located surface of the optoelectronic component are situated inside the same plane. This allows the realization of a continuous, broad optoelectronic device along this plane.

A method for the fabrication of an optoelectronic device according to one of the embodiments includes the following steps.

A) Supply an optoelectronic component with an active zone and at least one first conductive path on a first substrate, wherein the first conductive path is electroconductively connected to the active zone;

B) Apply an electrically conductive medium onto the first conductive path in a contact zone;

C) Supply a second substrate with at least one second conductive path; and

D) Apply the second substrate above the first substrate, so that the second conductive path is electro-conductively connected to the electrically conductive medium.

Step A) can be used to create an optoelectronic component with an active zone having one or multiple features of the above described embodiments. In step C) a second substrate made of glass can be supplied, which also has one or more features of the above described embodiments.

It can furthermore be possible to perform step B) after step C). Step B) can, in particular, be used to apply an electrically conductive medium in addition or alternatively to the second conductive path in the contact zone of the second substrate instead of onto the first substrate.

In a further embodiment of the procedure, a step E) is used to configure at least one electric component on the second substrate. The electric component can be electrically connected to the second conductive path. In particular, the electric component can be attached to the second substrate with an electrically conductive adhesive, for example an electrically anisotropic conductive adhesive or solder. This can be used for the electroconductive connection to the second conductive path. Alternatively, an electrically conductive connection between the electric component and the second conductive path can be created by bonding.

Process step E) can be performed after step C) or after step D).

In a further embodiment of the procedure, a lead is supplied in a step F). Furthermore, an electrically conductive connection of the lead with the electric component can be created. Process step F) can be performed after at least one of steps C), D) or E).

In another process step G) at least the electric component can be enclosed by a synthetic material layer, which can include epoxy resin. In particular, this can provide protection of at least the electric component. Alternatively or in addition, other or additional elements of the optoelectronic device can be enclosed.

Process steps of the above described embodiments of fabrication methods can, in particular, include process steps and/or features from tape-automated bonding processes, chip-on-film processes and chip-on-glass processes. Conductive paths can furthermore be deposited by methods known to the professional, like photolithography and/or by using masks, for example.

FIG. 1A shows an embodiment of an optoelectronic device 100. The optoelectronic device has an optoelectronic component 1 with a first substrate 10 made of glass.

On a first main surface 101 of the first substrate 1, the optoelectronic component 1 has an active zone 11 suitable for the emission of electromagnetic radiation. The optoelectronic component 1 is an OLED. Deposited on the main surface 101 are the first electrode 111, organic functional layers 110, and a second electrode 112, which make up the OLED.

The active zone furthermore includes an encapsulation 113 suitable to protect the electrodes 111, 112 and the functional layers 110 from harmful external exposure to environmental constituents such as humidity or oxygen. The active zone can include features as described in the general part of the application, for example, structured first and second electrodes 111, 112.

In the embodiment shown here, the optoelectronic component 1 is a bottom-emitter. This means that in the active zone, the electromagnetic radiation is emitted through the first substrate 10. In order to increase contrast and avoid the reflection of light, which can impinge from the outside onto the active zone and in particular onto the electrodes 111, 112, a circular polarizer 114 is located on an opposite main surface 102 of the substrate 10 located opposite the first main surface 101.

The embodiment of the optoelectronic component 1 shown in FIG. 1 and especially of the active zone serves as a sample only and can be modified or expanded according to the features described in the general part.

The first and the second electrodes 111, 112 are electroconductively connected to the first conductive paths 12, which are attached to the first main surface 101 of the first substrate 10. The first conductive paths 12 in the shown embodiment have a first ITO-layer 121 and in a contact zone 31 a second layer made of metal like copper or chrome. In the shown embodiment, the first layers 121 of the first conductive paths transition into the first electrodes 111. Alternatively, the first electrodes 111 and the first layers 121 of the first conductive paths 12 can also be configured separately from each other and be electroconductively connected. In some embodiments, the second layers 122 of the first conductive paths 12 extend into the active zone 11 and are in contact with the first electrodes 111.

The optoelectronic device 100 furthermore includes a second substrate 20 made of glass with a second main surface 201, on which an electric component 21, for example an integrated circuit (IC), is located. The IC is suitable to control or drive the active zone 11 of the optoelectronic component 1. In addition, attached to the second main surface are second conductive paths 22, which like the first conductive paths 12 include a first layer 221 of ITO and a second layer of copper or chrome. Alternatively, the second conductive paths 22 can also have only one layer made of one metal, such as copper or chrome.

The electric component 21 is furthermore electroconductively connected to a lead 23, which can be used to connect the electric component to an external current and/or voltage supply. As an alternative to the shown embodiment, the lead 23 can also be electroconductively connected to the electric component 21 via additional second conductive paths 22. The electric component 21 can be electroconductively connected to the second conductive paths 22 and/or to the lead 23 via adhesive, solder or bonded connections.

The second substrate 20 is configured in relation to the first substrate 10 such that the second main surface 201 and the first main surface 101 overlap in the contact zone 31. The first main surface and the second main surface 101, 102 in the shown embodiment are in particular flat and configured parallel to each other. Alternatively, the first substrate 10 can also be flexible.

Deposited between the first and the second conductive paths 12, 22 is an electrically anisotropic conductive adhesive 3, which electrically connects the first conductive paths 111 and the second conductive path 22 in respective pairs. The electrically anisotropic conductive adhesive 3 can also be used for a mechanically stable interconnection of the second substrate 20 and the optoelectronic component 1.

The electrically anisotropic conductive adhesive is especially suited to conduct current in a direction perpendicular to the first and/or the second main surface but not in parallel to them.

Furthermore, the electric component 21 as well as additional or other parts and zones of the second substrate 20 and/or of the optoelectronic component 1 can include a plastic enclosure (not shown) to increase the stability of the assembly and provide protection against external influences.

The second substrate 20 is located from the active zone and therefore from the encapsulation 113 a distance 30, which at a minimum is 0.1 mm. Furthermore, the second substrate 20 in the shown embodiment has thickness such that a main surface 203 of the second substrate 20 (opposite the second main surface 201) and an exterior surface 103 of the encapsulation 113 are located in the same plane or are coplanar. Therefore, the optoelectronic device has a flush (except for the distance 30) nearly continuous top surface without a step down or step up at the contact zone 31. Alternatively, the thickness of the substrate 20 can be such that the device has in the contact zone 31 a step.

The contact zone 31 can, in particular, be of a smaller size than the attachment area required for the electric component 21. This allows a larger area of the first main surface 101 to be used for the active zone than if the electric component were located on the first main surface 101 of the first substrate.

Figure 1B:
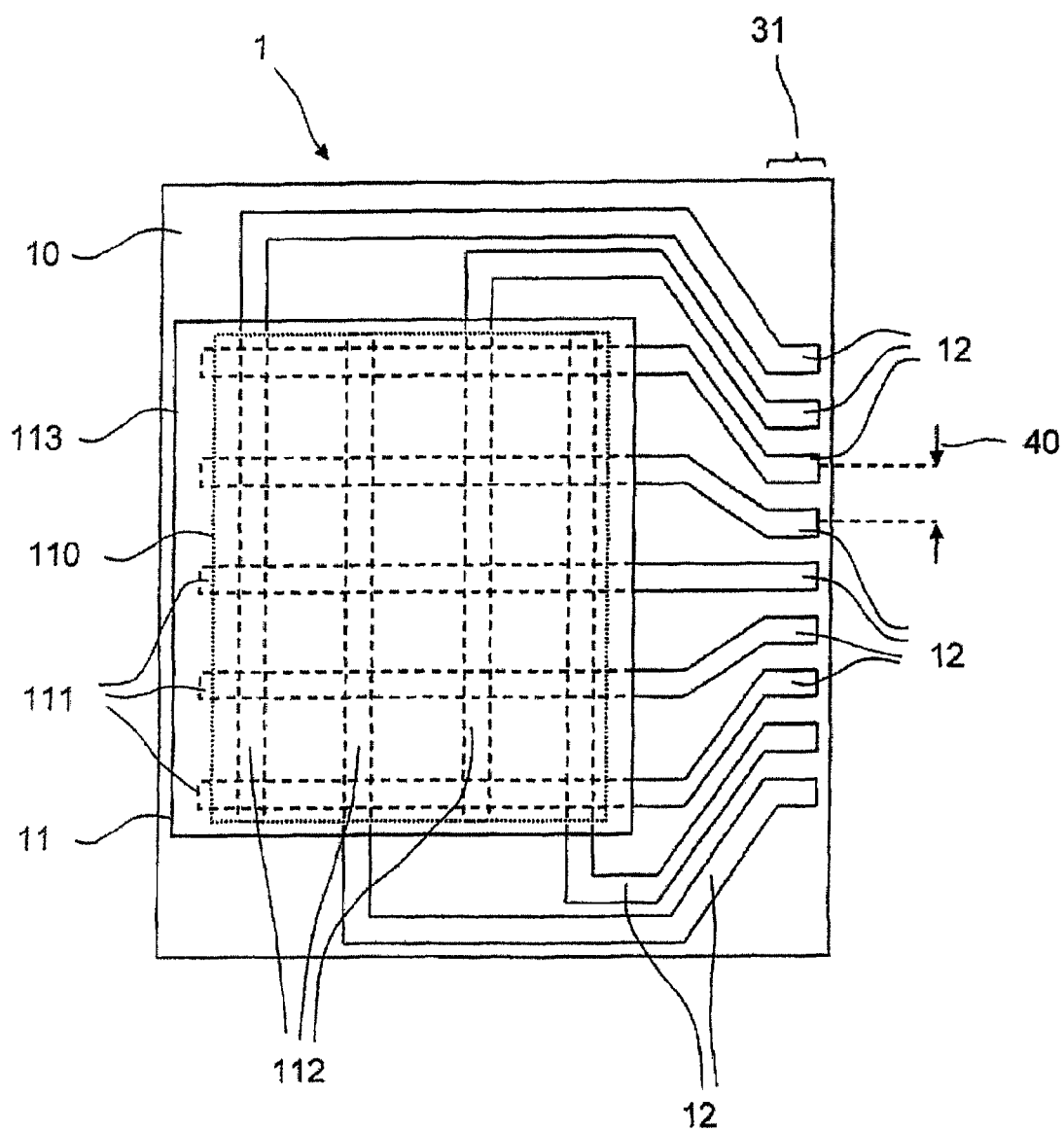
FIG. 1B shows a schematic representation of an optoelectronic device according to one embodiment.

FIG. 1B shows a schematic top view of an optoelectronic component 1, for example for an optoelectronic device 100 according to the previous embodiment in FIG. 1.

Deposited on the first substrate 10 is a multiple number of first conductive paths 12, which are electrically contacting the first and the second electrode sections 111, 112. The structure and the configuration of the first and the second electrode sections 111, 112 is for demonstration purposes only. The conductive paths 12 extend from the contact zone 31 on the first substrate 10 to the active zone 11. In the contact zone 31, the conductive paths 12 are adjacent to each other such that a distance 40 of about 120 μm is between each path 12, wherein the distance indicates a center-to-center distance, i.e., a grid, of the neighboring conductive paths 12. In order to test the optoelectronic component 1, for example before attaching it to the second substrate 20, conductive paths 12 can be electrically contacted to a suitable test fixture, allowing at least sections of the active zone 11 to operate for test purposes. The distance 40 of about 120 μm makes it easier to contact neighboring conductive paths 12 with the test fixture.

An optoelectronic device according to the embodiments of FIGS. 1A and 1B may provide high-efficiency/low-cost operation due to efficient material use and low material costs.

FIGS. 2A to 4 show further embodiments for optoelectronic devices 200, 300, 400.

Figure 2A:
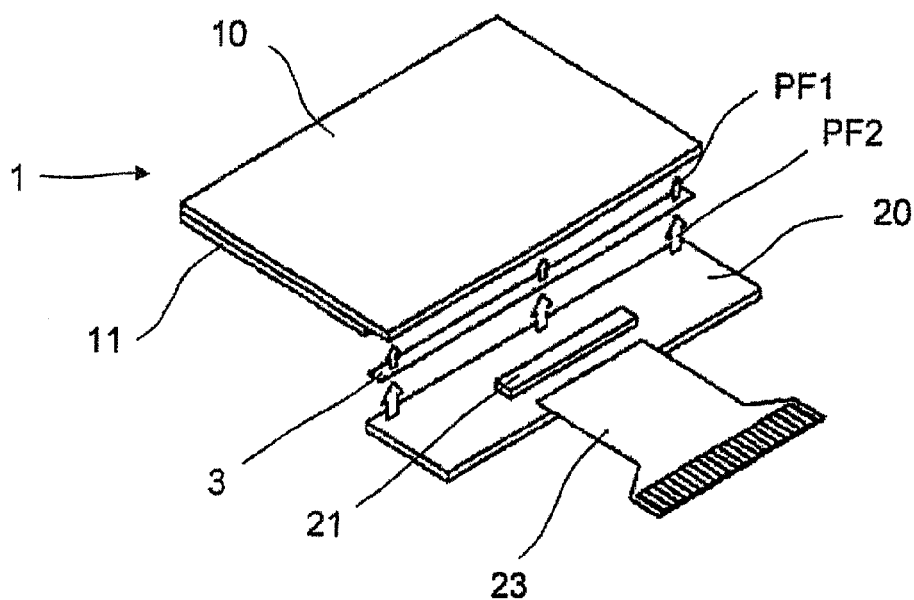
FIGS. 2A and 2B show schematic representations of an optoelectronic device according to a further embodiment.
Figure 2B:
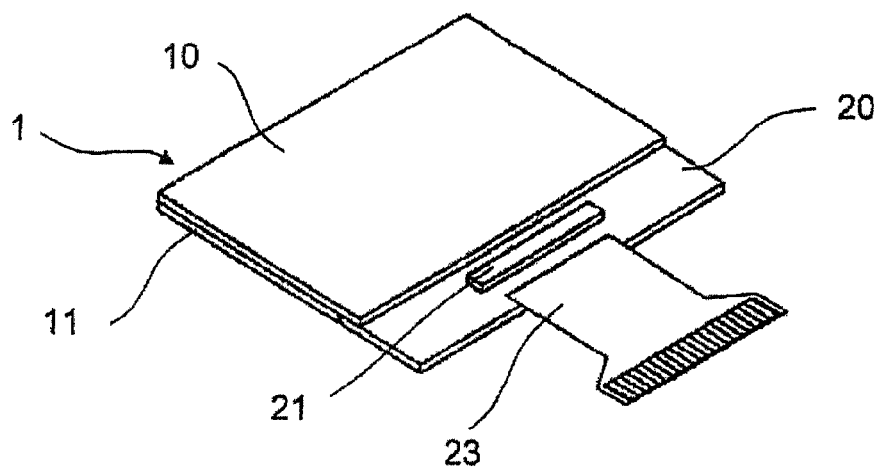

FIG. 2A shows a schematic explosive view of optoelectronic device 200, which can be configured according to the embodiments of FIGS. 1A and 1B. The arrows PF1, PF2 indicate the installation direction of the optoelectronic component 1, the electric anisotropic conductive adhesive 3 and the second substrate 20. FIG. 2B shows the completed optoelectronic device 200. In the shown embodiment the optoelectronic device 200 includes an electric component, for example, an IC.

Figure 3:
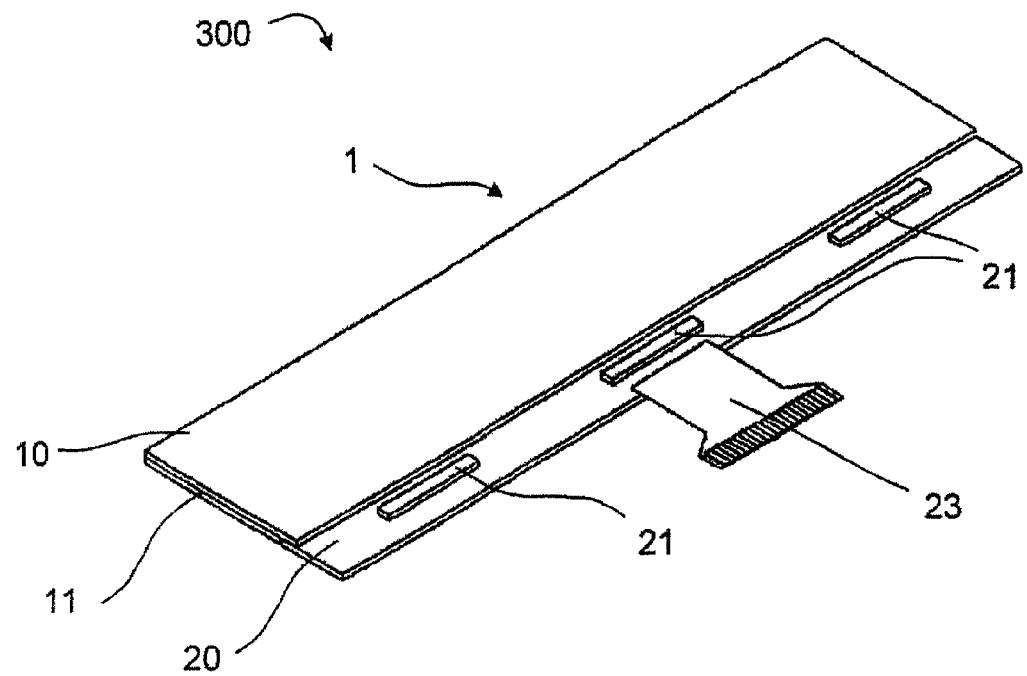
FIG. 3 shows a schematic representation of an optoelectronic device according to a further embodiment.

The embodiment according to FIG. 3 shows an optoelectronic device 300, which in contrast to the optoelectronic device 200 of the embodiment according to FIGS. 2A and 2B has multiple electric components 21 on the second substrate. The multiple electric components 21 can be connected as shown, for example, via lead 23, which can include a plastic film with integrated conductive paths to additional electronic components or to a current and/or voltage supply. Alternatively, every electric component 21 can be connected via its own lead 23.

Figure 4:
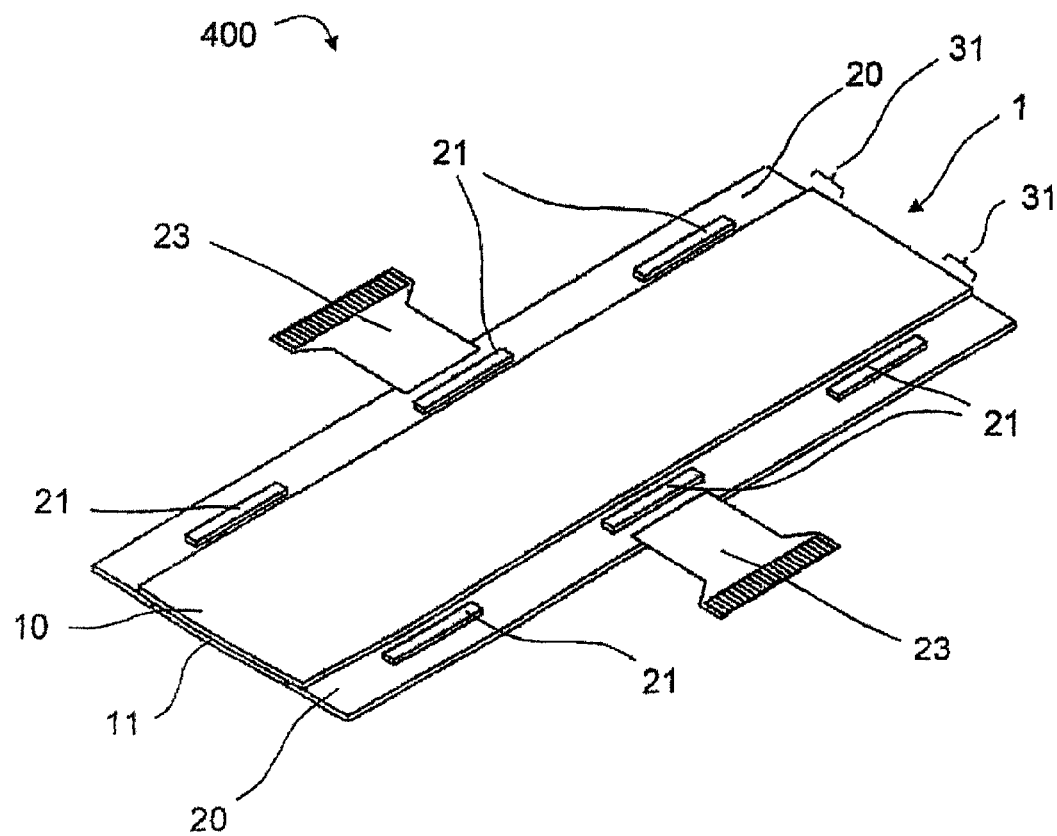
FIG. 4 shows a schematic representation of an optoelectronic device according to further embodiment.

The optoelectronic device 400 according to the embodiment in FIG. 4 has two second substrates with multiple electric components 21 each. The optoelectronic component 1 can, as shown, have on two opposite sides of the substrate 10 contact zones 31.

Optoelectronic devices according to the optoelectronic devices 100, 200, 300, 400 shown in FIGS. 1A to 4 can be especially well suited for use in display and/or lighting devices, which are characterized by the cost-efficient production of a space-saving and flat design.

FIG. 5 shows a method for the fabrication of an optoelectronic device according to one of the previous embodiments. In the first step 901, an optoelectronic component 1 is supplied. In step 902 an electric anisotropic conductive adhesive 3 is deposited on the first conductive paths 12 in the contact zone 31 of the first main surface 101.

In step 903, a second substrate 20 with second conductive paths 22 on a second main surface 201 is supplied, which in step 904 is attached above the optoelectronic component 1 in such manner that the electric anisotropic conductive adhesive 3 creates an electrically conductive connection between the first and the second conductive paths 12, 22. Step 904 can also include the hardening of the electric anisotropic conductive adhesive 3. Alternatively or in addition, step 902 can also be performed after step 903 in such manner that the electrically anisotropic conductive adhesive 3 is applied on the second conductive paths 22 in the contact zone 31 of the second main surface 201. In particular, step 902 and 904 can include features of so-called "hot thermode bonding", which can include applying a temperature change, e.g., heating, or pressure. A temperature change can be provided by a pulsed introduction of controlled heat.

In step 905, an electric anisotropic conductive adhesive is applied on the second substrate over the second conductive paths 22 in an area in which an electric component 21 shall be positioned. In step 906, a suitable electric component 21, for example an IC, which can be used to control the opto-electronic component 1, is supplied, and in step 907 attached to the second main surface 201 of the second substrate 20 and, for example, through hardening of the adhesive electroconductively connected to the second conductive paths 22 and the substrate 20. Alternatively, the electric component can, with an adhesive or a solder, which in step 905 is deposited on the second substrate 20, be attached in a mechanically stable manner, i.e., bonded, and in step 907, an electric connection between the second conductive paths 22 and the electric component 21 is provided by bonding.

In step 908, a lead 23, for example, a plastic ribbon or a plastic film with conductive paths, is supplied in step 909. The lead 23 is electroconductively connected to the electric component 21. The lead 23 can be glued to the second substrate 20, or connected with an electrically conductive adhesive to second conductive paths and/or the electric component 21 in an electroconductive and mechanically sound manner. Alternatively, the electric connection can also be created by bonding.

In step 910, at least part of the optoelectronic device, for example the electric component and/or lead, is enclosed with an synthetic mass, like epoxy resin. This can also be used to protect the components as well as provide a more stable attachment. Alternatively or in addition, parts and/or sections of the optoelectronic component 1 can be enclosed.

The description of the invention based on the embodiments does not limit the invention to said embodiments. The invention rather includes any new feature as well as any combination of features, especially including any combination of features in the patent claims, even if this feature or this combination itself is not explicitly indicated in the patent claims or sample embodiments.

What is claimed is:

1. An optoelectronic device, comprising:
an optoelectronic component with an active zone and at least one first conductive path on a first substrate; and
a second substrate with at least one second conductive path,
wherein the first conductive path is electroconductively connected to the active zone, the first conductive path and the second conductive path are electroconductively interconnected,
wherein the active zone on the first substrate is an optoelectronic active zone that emits electromagnetic radiation during operation or that converts electromagnetic radiation into electric current or electric voltage, wherein the electromagnetic radiation is in the range of ultraviolet to infrared wavelengths, and
wherein the second substrate is a stiff material.

2. The optoelectronic device according to claim 1, wherein the second substrate includes glass or is made entirely of glass.

3. The optoelectronic device according to claim 1, wherein:
the first substrate has a first main surface on which the active zone and the first conductive path are located;
the second substrate has a second main surface on which the second conductive path is located; and
the first main surface and the second main surface face each other.

4. The optoelectronic device according to claim 3, wherein the first main surface and the second main surface overlap in a contact zone.

5. The optoelectronic device according to claim 4, wherein the first main surface and the second main surface at least partially do not overlap.

6. The optoelectronic device according to claim 4, wherein the first conductive path and the second conductive path are at least partially located in the contact zone.

7. The optoelectronic device according to claim 1, wherein the first conductive path and the second conductive path are electroconductively interconnected via an electrically conductive medium.

8. The optoelectronic device according to claim 7, wherein the electrically conductive medium comprises an electrically conductive adhesive or an electrically anisotropic conductive adhesive.

9. The optoelectronic device according to claim 1, wherein the first conductive path or the second conductive path has at least one layer comprised of an electrically conductive oxide or a metal.

10. The optoelectronic device according to claim 1, wherein the first conductive path or the second conductive path includes a sequence of layers with at least a first layer with an electrically conductive oxide and a second layer with a metal.

11. The optoelectronic device according to claim 10, wherein the metal is comprised of copper and chrome.

12. The optoelectronic device according to claim 1, wherein:
the first conductive path comprises a plurality of first conductive paths; and
the second conductive path comprises a plurality of conductive paths.

13. The optoelectronic device according to claim 12, wherein one of the first conductive paths is electroconductively interconnected with a one of the second conductive paths to form a one-to-one connection.

14. The optoelectronic device according to claim 12, wherein adjacent first conductive paths of the plurality of the first conductive path have at least a center-to-center distance of more than about 50 µm between each other.

15. The optoelectronic device according to claim 1, with at least two second substrates, wherein:
each of the at least two second substrates has at least one second conductive path; and
the optoelectronic component is electroconductively connected to each of the at least two second substrates via a respective first conductive path.

16. The optoelectronic device according to claim 1, wherein the second substrate has at least one electrical component, which is electroconductively connected to the at least one second conductive path.

17. The optoelectronic device according to claim 16, wherein the at least one electric component comprises a plurality of electric components.

18. The optoelectronic device according to claim 16, wherein the electric component is suitable to control the optoelectronic component.

19. The optoelectronic device according to claim 16, wherein the at least one electric component comprises an optoelectronic component.

20. The optoelectronic device according to claim 16, wherein the at least one electric component is electroconductively connected to a lead.

21. The optoelectronic device according to claim 1, wherein the optoelectronic component has an active zone, which during operation emits electromagnetic radiation.

22. The optoelectronic device according to claim 1, wherein the optoelectronic component is an organic optoelectronic component.

23. The optoelectronic device according to claim 1, wherein the active zone and the second substrate are at least 0.1 mm from each other.

24. The optoelectronic device according to claim 1, wherein the second substrate has a thickness such that the second substrate does not extend beyond a top surface of the optoelectronic component.

25. The optoelectronic device according to claim 24, wherein the second substrate has one main surface facing away from the second main surface, which is coplanar with a neighboring surface of the optoelectronic component.

26. A method for the fabrication of an optoelectronic device comprising:
    supplying an optoelectronic component with an active zone and at least one first conductive path on a first substrate, wherein the first conductive path is electroconductively connected to the active zone;
    applying an electrically conductive medium on the first conductive path in a contact zone;
    supplying a second substrate with at least one second conductive path; and
    positioning the second substrate over the first substrate such that the second conductive path is electroconductively connected to the electrically conductive medium,
    wherein the active zone on the first substrate is an optoelectronic active zone that emits electromagnetic radiation during operation or that converts electromagnetic radiation into electric current or electric voltage, wherein the electromagnetic radiation is in the range of ultraviolet to infrared wavelengths, and
    wherein the second substrate is a stiff material.

27. A method according to claim 26, further comprising attaching at least one electric component to the second substrate, so that the electric component is electroconductively connected to the second conductive path.

28. A method according to claim 27, further comprising supplying a lead and creating an electrically conductive connection of the lead to the electric component.

29. A method according to claim 27, further comprising enclosing at least the electric component within a plastic film.

30. An optoelectronic device, comprising:
    an optoelectronic component with an active zone and at least one first conductive path on a first substrate; and
    a second substrate with at least one second conductive path, wherein the first conductive path is electroconductively connected to the active zone, the first conductive path and the second conductive path are electroconductively interconnected, and the first and second substrates each comprise glass,
    wherein the first substrate has a first main surface on which the active zone and the first conductive path are located, the second substrate has a second main surface on which the second conductive path is located; and the first main surface and the second main surface face each other.

31. An optoelectronic device, comprising:
    an optoelectronic component with an active zone and at least one first conductive path on a first substrate;
    a second substrate with at least one second conductive path, wherein the first conductive path is electroconductively connected to the active zone, the first conductive path and the second conductive path are electroconductively interconnected, and the first and second substrates each comprise glass; and
    an encapsulation disposed adjacent to the second substrate and at least partially enclosing the active zone.

* * * * *